United States Patent [19]
Glenn et al.

[11] Patent Number: 5,034,068
[45] Date of Patent: Jul. 23, 1991

[54] PHOTOVOLTAIC CELL HAVING STRUCTURALLY SUPPORTING OPEN CONDUCTIVE BACK ELECTRODE STRUCTURE, AND METHOD OF FABRICATING THE CELL

[75] Inventors: Gregory S. Glenn, Los Angeles; David R. Lillington, Granada Hills, both of Calif.

[73] Assignee: Spectrolab, Inc., Sylmar, Calif.

[21] Appl. No.: 483,620

[22] Filed: Feb. 23, 1990

[51] Int. Cl.$^5$ .............................. H01L 31/06
[52] U.S. Cl. ..................... 136/256; 136/262; 437/2; 437/5; 357/30; 357/65; 357/68
[58] Field of Search .............. 136/256, 262; 357/30 J, 357/30 K, 30 Q, 65, 68; 437/2–5, 181, 184, 185, 187

[56] References Cited
U.S. PATENT DOCUMENTS 3,988,167 10/1976 Kressel et al. .................. 136/256
4,171,989 10/1979 Pryor ............................. 136/256
4,416,052 11/1983 Stern ................................ 437/5
4,487,989 12/1984 Wakefield et al. ............. 136/256

Primary Examiner—Aaron Weisstuch
Attorney, Agent, or Firm—Terje Gudmestad; W. K. Denson-Low

[57] ABSTRACT

A photoresponsive layer formed of a semiconductive material such as gallium arsenide has differently doped strata which define a junction therebetween, and generates a photovoltaic effect in response to light incident on a front surface thereof. A front electrode is formed on the front surface. A structurally supporting back electrode open conductive support or grid structure is formed on a back surface of the photoresponsive layer. The support structure is sufficiently thick, approximately 12 to 125 microns, to prevent breakage of the photoresponsive layer, which may be as thin as approximately 25 to 100 microns. The support structure has a pattern selected to prevent propagation of a crack through the photoresponsive layer thereof.

35 Claims, 2 Drawing Sheets

PHOTOVOLTAIC CELL HAVING STRUCTURALLY SUPPORTING OPEN CONDUCTIVE BACK ELECTRODE STRUCTURE, AND METHOD OF FABRICATING THE CELL

BACKGROUND OF THE INVENTION

1. Field of the Invention

The present invention generally relates to photoelectric devices, and more specifically to a photovoltaic cell having a structurally supporting back electrode open conductive support or grid structure.

2. Description of the Related Art

A conventional photovoltaic or solar cell includes a photoresponsive sheet or layer of material which generates a photovoltaic effect in response to light incident on a front surface thereof. The photoresponsive layer may be formed of a single crystalline, semiconductive material such as silicon, and have differently doped strata which define a junction therebetween. Alternatively, the photoresponsive layer may include strata of dissimilar materials such as cadmium sulfide/copper sulfide, or aluminum gallium arsenide (AlGaAs) and gallium arsenide (GaAs). Front and back electrodes are formed on the front and back sides of the photoresponsive layer, respectively, in ohmic connection therewith. The back electrode is generally a continuous metal layer or film, since it is not required to transmit light therethrough. The front electrode may be formed of a transparent conductive oxide (TCO) such as indium tin oxide (ITO), a thin grid pattern of a metal such as copper, aluminum, silver, titanium/palladium/silver, or a combination thereof. Light incident on the front of the photoresponsive layer causes liberation of electron-hole pairs therein due to the photovoltaic effect. The electrons and holes flow out of the photoresponsive layer to an external load through one of the front and back electrodes, the direction of flow depending on the relative doping polarities of the strata in the photoresponsive layer.

U.S. Pat. No. 4,273,950, issued June 16, 1981, entitled "SOLAR CELL AND FABRICATION THEREOF USING MICROWAVES", to S. Chitre, discloses an example of a solar cell having a silicon photoresponsive layer, a continuous back electrode, and a front electrode grid including metal conductors which are 2,500 microns wide and 2 microns thick. The grid structure covers approximately 8 to 10% of the area of the front surface of the photoresponsive layer. This is a compromise between the objectives of maximizing the junction area that is exposed to light (which requires minimum conductor area), while at the same time maximizing the current collecting capability of the grid structure.

Another example of a front electrode grid structure is disclosed in U.S. Pat. No. 4,348,546, issued Sept. 7, 1982, entitled "FRONT SURFACE METALLIZATION AND ENCAPSULATION OF SOLAR CELLS", to R. Little. This grid is in the form of a grid of wires of sufficiently high tensile strength to be self-supporting while being drawn from spools or the like into contact with one or more components of the solar cell before completion of the cell's fabrication.

The above referenced patents each disclose a solar cell having a continuous back metal electrode. U.S. Pat. No. 4,795,500, issued Jan. 3, 1989, entitled "PHOTOVOLTAIC DEVICE", to Y. Kishi, discloses a solar cell having a front, transparent ITO electrode, and a back metal electrode which has holes formed therethrough. The purpose of the holes is to allow a part of the light incident on the cell to be transmitted therethrough for lighting the inside of a room, automotive vehicle, or the like.

Conventional back electrodes, whether or not they are formed with holes for transmissibility, are made quite thin, on the order of several microns. This dimension is consistent with their function of collecting current generated by the photovoltaic effect in the photoresponsive layer.

Although gallium arsenide (GaAs), or GaAs on Ge cells, generate $\frac{1}{3}$ more power than standard silicon cells, they have the disadvantages of higher weight and manufacturing cost. Current techniques allow for thinning of GaAs solar cells to approximately 125 microns using a Strasbaugh grinding machine or etching process. Thinner cells are not cost effective due to excessive attrition through breakage.

Thin solar cells are further prone to cracking. Propagation of a crack perpendicular to the direction of current flow in a circuit having a number of cells connected in series has the potential of reducing the output of the circuit to zero. A standard practice for preventing a crack from breaking electrical conductivity in a series cell string is to weld or solder a T-bar strap across the back metal electrode of each cell. However, this adds weight to the cell, and requires 2 to 4 additional applications of localized heating which increases the risk of cell breakage through thermal stress.

SUMMARY OF THE INVENTION

In accordance with the present invention, the back electrode or electrical contact on a thin crystalline solar cell (Si, GaAs, Ge, GaSb, AlGaAs, InP, etc.) is deposited in an open conductive support or grid structure to a thickness of 25 to 100 microns. The pattern and metal thickness support the crystal during assembly and operation of the panel, and restrict crack propagation. In regions of the support structure underneath the front side interconnect attachment pads, there are corresponding pads which provide support for front side welding or soldering. There are additional pads on the support structure for backside interconnect attachment. A peripheral border portion of the support structure further reduces the risk of cell breakage from cracks emanating from the cell edges.

A 60 micron thick metal grid is approximately 12 times thicker than the traditional 5 micron solid metal back, yet adds no mass penalty to the cell because of its minimal surface area. The thick metal support structure also adds support to the solar cell crystal, allowing a high density crystal such as GaAs or other group III-V or II-VI material to be thinned down to 50 microns using a Strasbaugh grinding machine or etching process. A 50 micron thick GaAs cell has approximately 36% more power output and weighs approximately 43% less than a standard 200 micron thick silicon solar cell of the same area. In addition, the open support structure is more efficient in reducing the amount of heat generated in the photocell than a conventional solid metal back electrode.

The present invention provides a method of fabricating a solar cell having higher output and lower weight than conventional solar cells, at low cost on a commercial production basis. This is because the structurally supporting back electrode grid rigidizes and strengthens the easily damaged crystalline photoresponsive layer, thus enabling solar cells to be manufactured economically with a 50 to 75 micron thickness. The greatly reduced rate of attrition through breakage provides substantially reduced manufacturing and assembly costs by increasing yield.

More specifically, a photoresponsive layer formed of a semiconductive material such as gallium arsenide has differently doped strata which define a junction therebetween, and generates a photovoltaic effect in response to light incident on a front surface thereof. A front electrode is formed on the front surface. A structurally supporting back electrode open conductive support or grid structure is formed on a back surface of the photoresponsive layer. The support structure is sufficiently thick, approximately 12 to 125 microns, to prevent breakage of the photoresponsive layer, which may be as thin as approximately 25 to 100 microns. The support structure has a pattern selected to prevent propagation of a crack through the photoresponsive layer thereof.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
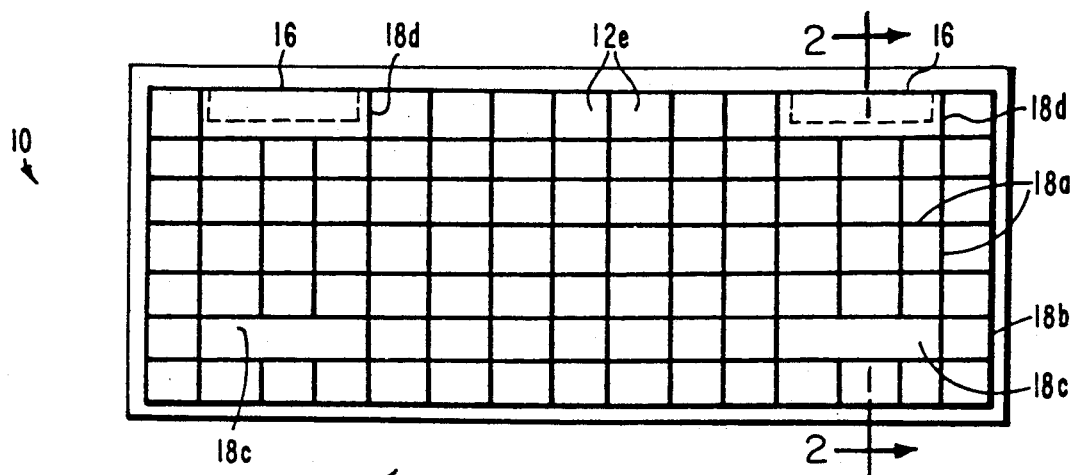
FIG. 1 is a plan view of a photoelectric cell embodying the present invention viewed from a back side thereof.
Figure 2:
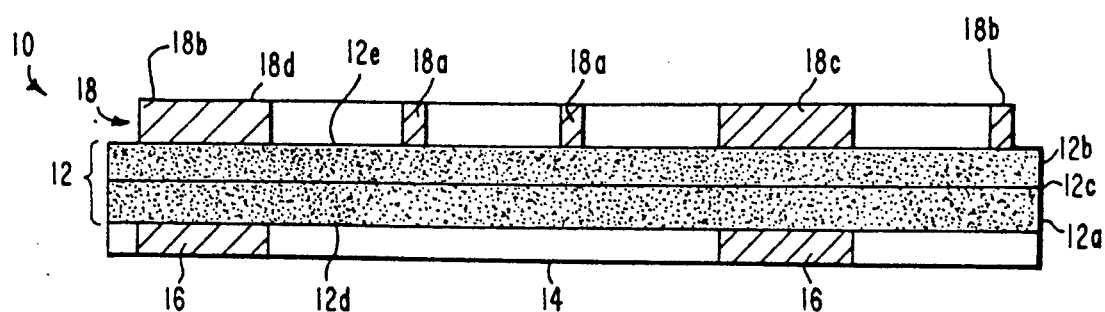
FIG. 2 is a section taken on a line II—II of FIG. 1.
Figure 3:
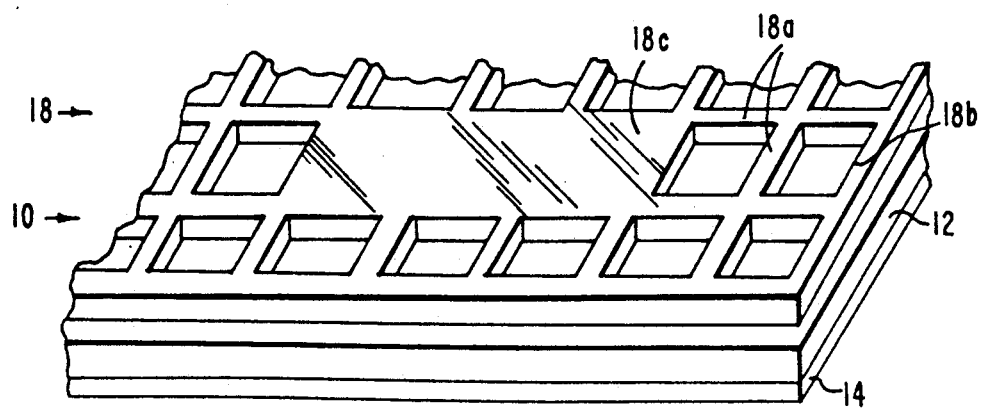
FIG. 3 is a fragmentary perspective view of a lower right corner area of the cell illustrated in FIG. 1.

Referring now to FIGS. 1 to 3 of the drawing, a photoelectric device or solar cell embodying the present invention is generally designated as 10 and includes a photoresponsive layer 12. The layer 12 may be formed of a high density, single crystalline semiconductive material such as GaAs, having strata 12a and 12b which are doped to opposite polarities. More specifically, one of the strata 12a and 12b is doped with a P-type impurity, whereas the other of the strata 12a and 12b is doped with an N-type impurity, to define a semiconductor P-N junction 12c therebetween. In response to light incident on an upper surface 12d of the layer 12, electron-hole pairs are generated by the photovoltaic effect in the area of the junction 12c. Depending on the relative doping of the strata 12a and 12b, the liberated electrons will move away from the junction 12c toward either the front surface 12d or a back surface 12e of the layer 12, and the liberated holes will move toward the opposite surface.

The semiconductive material of the layer 12 is not limited to GaAs, with other suitable materials including Si, Ge, and InP, either singly or in a combination of two or more materials. Furthermore, the scope of the present invention is not limited to a photovoltaic cell. The invention is equally applicable to a photoelectric device in which the photoresponsive layer produces any useful effect in response to incident light. Examples of such a photoresponsive layer include a photoresistor, or a photodiode or phototransistor array.

The device 10 further includes a front electrode 14 formed on the front surface 12d of the photoresponsive layer 12 in ohmic connection therewith. The particular configuration of the front electrode 14 is not the subject matter of the invention, and may take a number of forms. As illustrated, the front electrode 14 consists of a thin metallic grid, which is several microns thick, imbedded in an anti-reflection coating. A plurality of front interconnect attachment pads 16 made of an electrically conductive metal such as silver or nickel are ohmically bonded to the front electrode 14. The pads 16 constitute terminals for connection of the front of the cell 10 to an external circuit.

In accordance with a novel feature of the present invention, a structurally supporting back electrode open conductive support or grid structure 18 including a plurality of electrical conductors 18a is formed on the back surface 12e of the photoresponsive layer 12 in ohmic connection therewith. As illustrated in FIGS. 1 to 3, the conductors 18a are arranged in a rectangular pattern of parallel strips. The support structure 18 further includes a crack resisting border portion 18b which extends around the periphery thereof, and a plurality of back interconnect attachment pads 18c which constitute terminals for connection of the back of the cell 10 to the external circuit. In addition, the support structure 18 includes support pads 18d which are aligned with the front interconnect attachment pads 16 respectively. In the exemplary configuration illustrated in the drawings, the support pads 18d merge with the adjacent regions of the border portion 18b.

The support structure 18 is made of an electrically conductive material, such as metallic silver, nickel, copper, aluminum, titanium, palladium, or any practical combination thereof, which is sufficiently strong to provide support for the photoresponsive layer 12. More specifically, the process or method of forming the cell 10 in accordance with a preferred embodiment of the present invention includes providing the photoresponsive layer 12 in the form of a GaAs wafer having an initial thickness of approximately 200 to 300 microns. A process such as liquid phase epitaxy (LPE) or metal organic chemical vapor deposition (MOCVD) is used to form the strata 12a and 12b on the front surface 12d through the introduction of appropriate doping impurities into the semiconductive material of the layer 12. The front electrode 14 is then formed on the front surface 12d of the photoresponsive layer 12.

The structure is mounted on a supporting superstrate (not shown), with the back surface 12e facing outwardly. The layer 12 is then thinned down by a process such as grinding or etching to a final thickness of approximately 50 to 100 microns, most preferably between 50 to 75 microns. The grinding process may be performed using a Strasbaugh grinding machine, whereas etching may be performed using a solution of ammonium hydroxide and hydrogen peroxide.

After the photoresponsive layer 12 has been reduced to its final thickness, the support structure 18 is then formed by a process such as photolithography or evaporation through a mask on the back surface 12e to a thickness of between approximately 12 to 125 microns, most preferably between 50 and 75 microns. The structure is then removed from the superstrate, and sintered to form ohmic contact between the photoresponsive layer 12, the front electrode 14, and the support structure 18. The front interconnect attachment pads 16 are formed on the front electrode 14 over the front surface 12d in alignment with the support pads 18d.

The actual thicknesses of the photoresponsive layer 12 and support structure 18 may vary within a considerable range depending on the particular materials which are used. It would generally be expected that the thicknesses of the photoresponsive layer 12 and support structure 18 will be within one order of magnitude of each other (the support structure 18 will be between 0.1 and 10 times the thickness of the photoresponsive layer 12), but this relationship should not be considered as a limitation of the invention.

The support structure 18 may be substantially rigid, or may have a desired degree of flexibility. The support structure 18 may have any practical thickness within the scope of the present invention as long as it is strong enough to provide structural support for the photoresponsive layer 12. It will be noted that the back electrodes in prior art solar cells, which are only several microns in thickness, are not sufficiently strong to provide any practical degree of support for the photoresponsive layer as embodied by the present invention.

The pattern of the support structure 18 is designed in accordance with the particular materials selected to provide sufficient strength for the photoresponsive layer 12 without adding unacceptable weight, while enabling a sufficient amount of electric current to be collected from the strata 12b. For an exemplary cell having dimensions of 2 cm×4 cm, a GaAs photoresponsive layer 12 which is 50 microns thick, and a metal support structure 18, consisting typically of titanium/palladium/silver/nickel, which is 60 microns thick, the conductors 18a may be 60 microns wide, with the spacing between adjacent conductors 18a being 1,250 microns.

The support pads 18d prevent breakage of the photoresponsive layer 12 during attachment of the front interconnect attachment pads 16 and attachment of wire leads to the pads 16. During these operations, considerable force may be applied by a soldering or welding apparatus to the pads 16 which could break the photoresponsive layer 12 if the support pads 18d were not provided.

The support structure 18, in addition to providing structural support for the photoresponsive layer 12, prevents propagation of a crack therethrough in a direction parallel to the back surface 12e. Resistance to crack propagation from a corner of the cell 10 is enhanced by the provision of the border portion 18b. Whereas a conventional solid silver back electrode can "unzip" from edge to edge, the conductors 18a of the support structure 18 do not easily pass mechanical stresses from one to another, and thereby resist propagation of a crack through the pattern of the support structure 18.

Figure 4:
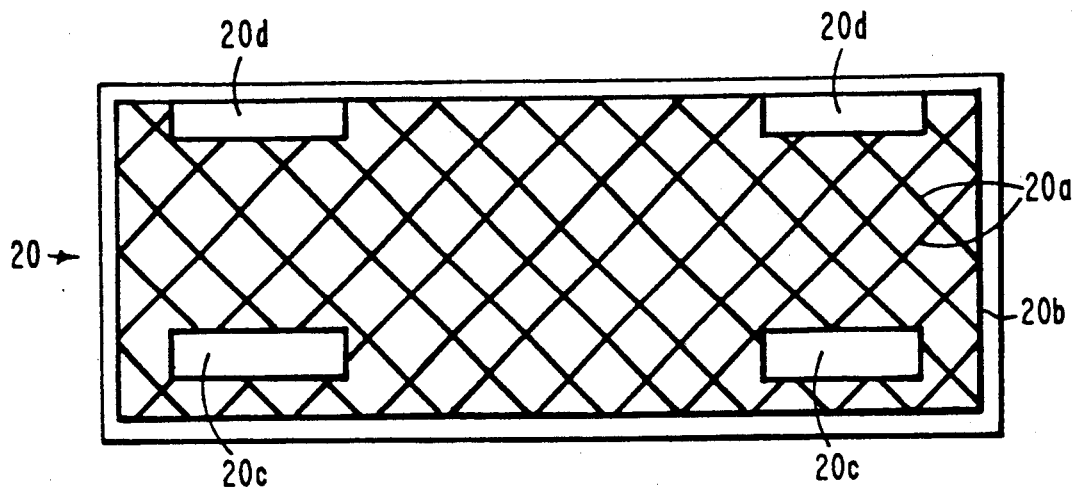
FIGS. 4, 5, and 6 are plan views illustrating alternative configurations of the present photoelectric cell.
Figure 5:
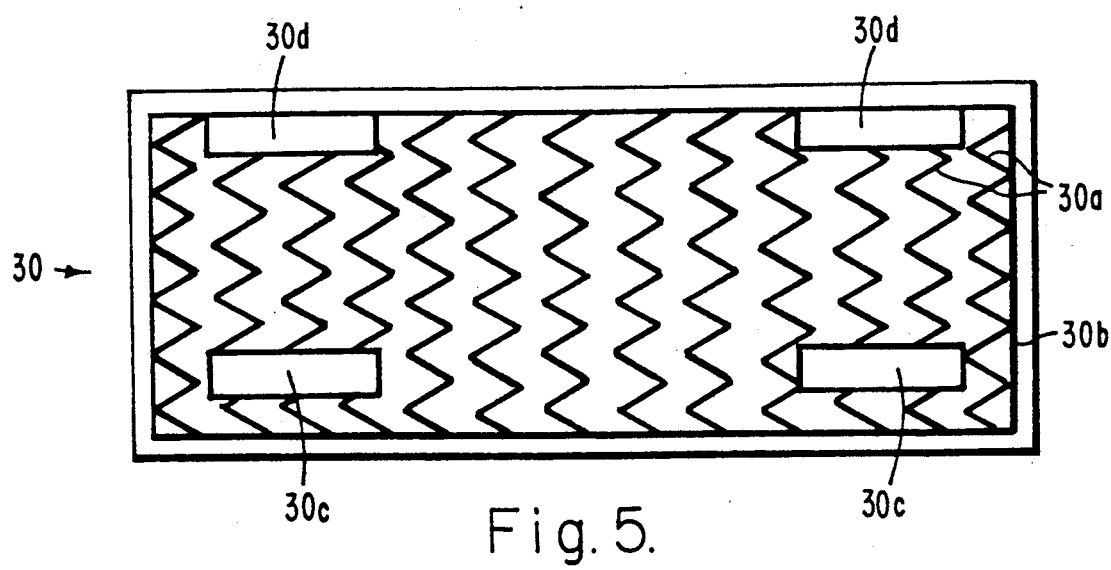
Figure 6:
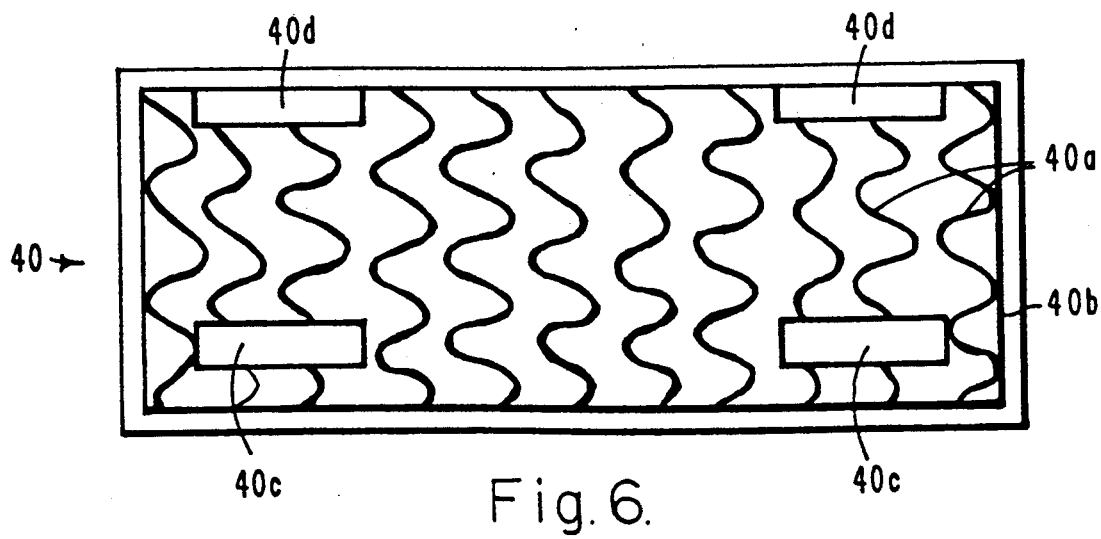

FIGS. 4 to 6 illustrate alternative patterns for the rear electrode support structure in accordance with the present invention, which may be formed by a process employing evaporation through a thin metal mask or by a photolithographic process. FIG. 4 illustrates a support structure 20 formed with conductors 20a in a diamond shaped pattern, a border portion 20b, rear interconnect attachment pads 20c, and support pads 20d. FIG. 5 illustrates a support structure 30 formed with conductors 30a in a zigzag pattern, a border portion 30b, rear interconnect attachment pads 30c, and support pads 30d. FIG. 6 illustrates yet another support structure 40 formed with conductors 40a in an undulating or serpentine pattern, a border portion 40b, rear interconnect attachment pads 40c, and support pads 40d.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A photoelectric device, comprising:
 a photoresponsive layer having a front light receiving surface, a back surface, and a thickness in the range between about 25 to 100 microns;
 front electrode means ohmically connected to the front surface; and
 an open back electrode support structure supporting the back surface of said photoresponsive layer and in ohmic connection therewith, said support structure having a thickness in the range between about 12 to 125 microns thick and being sufficiently strong as to minimize breakage of the photoresponsive layer.

2. A device as in claim 1, in which the photoresponsive layer comprises a semiconductor material having differently doped strata which define a junction therebetween, the photoresponsive layer generating a photovoltaic effect in response to light incident on the front surface.

3. A device as in claim 1, in which the support structure has a rectangular grid pattern.

4. A device as in claim 1, in which the support structure has a diamond shaped grid pattern.

5. A device as in claim 1, in which the support structure has a zig-zag pattern.

6. A device as in claim 1, in which the support structure has a serpentine pattern.

7. A device as in claim 1, in which the support structure has a crack resisting peripheral border portion.

8. A device as in claim 1, in which the support structure is further formed with at least one interconnect attachment pad for interconnection with an external circuit.

9. A device as in claim 1, in which the front electrode means comprises at least one front interconnect attachment pad for interconnection with an external circuit, the support structure being further formed with a support pad aligned with each front interconnect attachment pad respectively.

10. A device as in claim 12, in which the photoresponsive layer comprises a material selected from the group consisting of Si, GaAs, GaSb, AlGaAs, Ge, and InP.

11. A device as in claim 1, in which the support structure comprises a metal material selected from the group consisting of nickel, silver, copper, aluminum, titanium, palladium, and any combination thereof.

12. A device as in claim 1, in which the support structure comprises a metal material.

13. A device as in claim 1, in which the thickness of the photoresponsive layer is reduced from an initial value to a final value by grinding.

14. A device as in claim 1, in which the thickness of the photoresponsive layer is reduced from an initial value to a final value by etching.

15. A device as in claim 1, in which the support structure is sufficiently strong to prevent propagation of a crack through the photoresponsive layer.

16. A device as in claim 1, in which the support structure is formed by photolithography.

17. A device as in claim 1, in which the support structure is formed by evaporation through a mask.

18. A method of fabricating a photoelectric device, comprising the steps of:
  (a) providing a photoresponsive layer having a front light receiving surface, a back surface, and an initial thickness value;
  (b) forming a structurally supporting back electrode open conductive support structure to a thickness of about 12 to 125 microns on the back surface in ohmic connection therewith; and
  (c) reducing the thickness of the photoresponsive layer from said initial thickness value to a final value between about 25 to 100 microns, said support structure being sufficiently strong as to minimize breakage of the photoresponsive layer.

19. A method as in claim 18, further comprising the step, performed between steps (a) and (b), of:
  (c) forming front electrode means on the front surface in ohmic connection therewith.

20. A method as in claim 18, in which step (c) comprises reducing the thickness of the photoresponsive layer from said initial value to said final value by grinding.

21. A method as in claim 18, in which step (c) comprises reducing the thickness of the photoresponsive layer from said initial value to said final value by etching.

22. A method as in claim 18, in which step (a) comprises providing the photoresponsive layer as including a material selected from the group consisting of Si, GaAs, Ge, InP, GaSb, and AlGaAs.

23. A method as in claim 18, in which step (b) comprises forming the support structure as including a metal material selected from the group consisting of nickel, silver, copper, aluminum, titanium, palladium, and any combination thereof.

24. A method as in claim 18, in which step (b) comprises forming the support structure as including a metal material.

25. A method as in claim 18, in which step (b) comprises forming the support structure in a rectangular grid pattern.

26. A method as in claim 18, in which step (b) comprises forming the support structure in a diamond shaped grid pattern.

27. A method as in claim 18, in which step (b) comprises forming the support structure in a zig-zag pattern.

28. A method as in claim 18, in which step (b) comprises forming the support structure in a serpentine pattern.

29. A method as in claim 18, in which step (b) further comprises forming a crack resisting peripheral border around the support structure.

30. A method as in claim 18, in which step (b) further comprises forming the support structure with at least one interconnect attachment pad for interconnection with an external circuit.

31. A method as in claim 18, further comprising the step, performed between steps (a) and (b), of:
  (c) forming front electrode means on the front surface in ohmic connection therewith;
  step (b) further including forming the support structure with a support pad aligned with a position on which a front interconnect attachment pad is to be formed on the front surface;
  the method further comprising the step, performed after step (b), of:
  (d) forming a front interconnect attachment pad for interconnection with an external circuit in said position on the front surface in ohmic connection with the front electrode means.

32. A method as in claim 18, in which step (b) comprises forming the support structure on the back surface by photolithography.

33. A method as in claim 18, in which step (b) comprises forming the support structure on the back surface by evaporation through a mask.

34. A device as in claim 18, in which:
  step (a) comprises providing the photoresponsive layer as including a semiconductive material;
  the process further comprising the step, performed between steps (a) and (b), of:
  (c) forming differently doped strata in the semiconductive material which define a junction therebetween, whereby the doped semiconductive material generates a photovoltaic effect in response to light incident on the front surface.

35. A device as in claim 18, in which steps (a) and (b) in combination comprise forming the photoresponsive layer and support structure as having thicknesses which are less than approximately one order of magnitude different from each other.

* * * * *